(12) United States Patent
Hughes et al.

(10) Patent No.: US 6,543,027 B1
(45) Date of Patent: Apr. 1, 2003

(54) ON-CHIP DETECTION OF CLOCK GITCHES BY EXAMINATION OF CONSECUTIVE DATA

(75) Inventors: Mark A Hughes, Dublin (IE); Joseph N Butler, Galway (IE); Neil O Fanning, Kilworth (IE)

(73) Assignee: 3Com Corporation, Santa Clara, CA (US)

( * ) Notice: Subject to any disclaimer, the term of this patent is extended or adjusted under 35 U.S.C. 154(b) by 134 days.

(21) Appl. No.: 09/671,121

(22) Filed: Sep. 28, 2000

(30) Foreign Application Priority Data

May 18, 2000 (GB) .............................................. 0011893

(51) Int. Cl.⁷ .............................................. G06F 11/00
(52) U.S. Cl. ...................... 714/799; 714/811; 714/817; 714/819; 714/822; 327/20
(58) Field of Search ................ 714/718, 724, 714/731, 736, 799, 817, 822, 814, 811, 819; 327/299, 20; 711/218

(56) References Cited

U.S. PATENT DOCUMENTS

| | | | | |
|---|---|---|---|---|
| 4,107,651 A | * | 8/1978 | Martin | 315/383 |
| 4,353,032 A | * | 10/1982 | Taylor | 327/20 |
| 4,495,621 A | * | 1/1985 | Nakagomi et al. | 327/31 |
| 4,560,981 A | * | 12/1985 | Jackson et al. | 345/440.1 |
| 4,578,666 A | * | 3/1986 | Anderson | 340/146.2 |
| 4,857,760 A | * | 8/1989 | Stuebing | 327/299 |
| 5,347,540 A | * | 9/1994 | Karrick | 370/305 |
| 5,381,421 A | * | 1/1995 | Dickol et al. | 714/736 |
| 5,526,286 A | * | 6/1996 | Sauerwein et al. | 702/79 |
| 5,854,996 A | * | 12/1998 | Overhage et al. | 324/121 R |
| 5,923,183 A | * | 7/1999 | Kim et al. | 326/27 |
| 6,281,704 B2 | * | 8/2001 | Ngai et al. | 326/101 |
| 6,285,396 B1 | * | 9/2001 | Har Shoshanim et al. | 348/180 |
| 6,286,125 B1 | * | 9/2001 | Leshay et al. | 714/56 |

FOREIGN PATENT DOCUMENTS

| | | |
|---|---|---|
| EP | 0897248 A2 * | 2/1999 |
| GB | 2 336 074 | 10/1999 |
| GB | 2 336 075 | 10/1999 |

* cited by examiner

Primary Examiner—Hong Kim
(74) Attorney, Agent, or Firm—Nixon & Vanderhye PC

(57) ABSTRACT

An application specific integrated circuit includes a clock recovery circuit which recovers from an input signal a repetitive sequence of data values wherein no two consecutive values are the same and a recovered clock. An address generator responds to the recovered clock to cause storage of the data values in said memory in a set of locations having addresses generated by the address generator, so that the address generated by the generator increments in response to a repetitive transition in the recovered clock. The existence of a clock glitch is found by reading the data values from the set of locations to determine whether any two consecutive locations contain the same data value.

1 Claim, 3 Drawing Sheets

ON-CHIP DETECTION OF CLOCK GITCHES BY EXAMINATION OF CONSECUTIVE DATA

FIELD OF THE INVENTION

This invention relates to integrated circuits ('chips') and more particularly to large scale integrated circuits, particularly application specific integrated circuits which include various processing and data storage means and a system for recovering at least one clock signal (called hereinafter simply 'clock') from input data. One example is a chip which constitutes all or modular part of a communication unit such as a high-speed switch for a packet-based data communication system. Nevertheless, the invention is intended to have a general utility in chips which require high precision clocks.

BACKGROUND TO THE INVENTION

Chips of the general nature indicated above require at least one and usually more than one clock which consists of, or should consist of, precisely regular occurring transitions between binary levels. The continued accuracy of the clock is essential for the reliable writing, reading and other processing of digital data. Owing to the increasing complexity of application specific integrated circuits and the increasing demands imposed by increasing data rates, currently in the range of gigabits per second, an application specific integrated circuit when laid out may not exhibit continually perfect clock signals. Generally, imperfections in clocks and particularly the occurrence of transitions at irregular or spurious intervals are termed 'glitches'. Such glitches may and frequently do cause unacceptable errors in the operation of the application specific integrated circuit. Accordingly it is desirable to be able to detect glitches in a clock at an early stage of manufacture.

In particular, the number and speed of flip-flops connected to any particular clock tree increases all the time. Many clocks are generated from clock recovery circuitry responsive to input signals, running at different voltage levels.

One aspect of the invention is the incorporation on a chip of a clock glitch detector. Various proposals exist for the detection of clock glitches. Early techniques employed pulse stretching and the use of a cathode ray tube, as discussed in U.S. Pat. No. 4,107,651. It is known from that patent to provide a technique which detects glitches in data but which employs for this purpose a clean sample clock synchronous to the data.

Another technique for glitch detection and intended for use within a logic analyzer is described in U.S. Pat. No. 4,353,032. This technique uses an internally generated sampling clock to sample the input data. The system will detect the existence of signals which have a duration of less than the period of the sample clock. For the detection of short glitches a high-speed clock is needed.

Various other techniques are known. It is known to multiplex the clock and known data patterns to output buffers of a chip and to use an oscilloscope device which is triggered by the glitch to provide a comparison of received and expected data patterns. This technique requires that there is enough buffer memory in a capturing device to store the data received around the time that the glitch occurs. It may not be possible to stop the triggering of the oscilloscope and accordingly the data captured by the oscilloscope at about the time of the glitch may be overwritten. Furthermore, the glitch may be too short and may be smoothed out by the capacitance of the test probes and test devices.

It is also known to multiplex the clock to an output buffer and to use a sampling oscilloscope to build a picture of the clock over time. The accuracy of this technique depends on the particular sampling scope which is used.

It has also been proposed to observe the symptoms of a clock glitch and to probe a chip. However, probing a chip is time consuming and the devices employed (such as stroboscopic scanning electron microscopes) are particularly expensive.

SUMMARY OF THE INVENTION

The present invention is based on the transmission of known data patterns repeatedly and the storage thereof in memory by means of an address generator which is clocked by the clock under investigation. The data may be written repeatedly into a set of storage locations in cyclic sequence. If a glitch occurs, a recovered data value will be clocked into two consecutive memory locations. The identity of two consecutive similar data values can be detected in real time or otherwise.

Further features of the invention will be apparent from the detailed description which follows.

DETAILED DESCRIPTION OF A PREFERRED EXAMPLE

Figure 1:
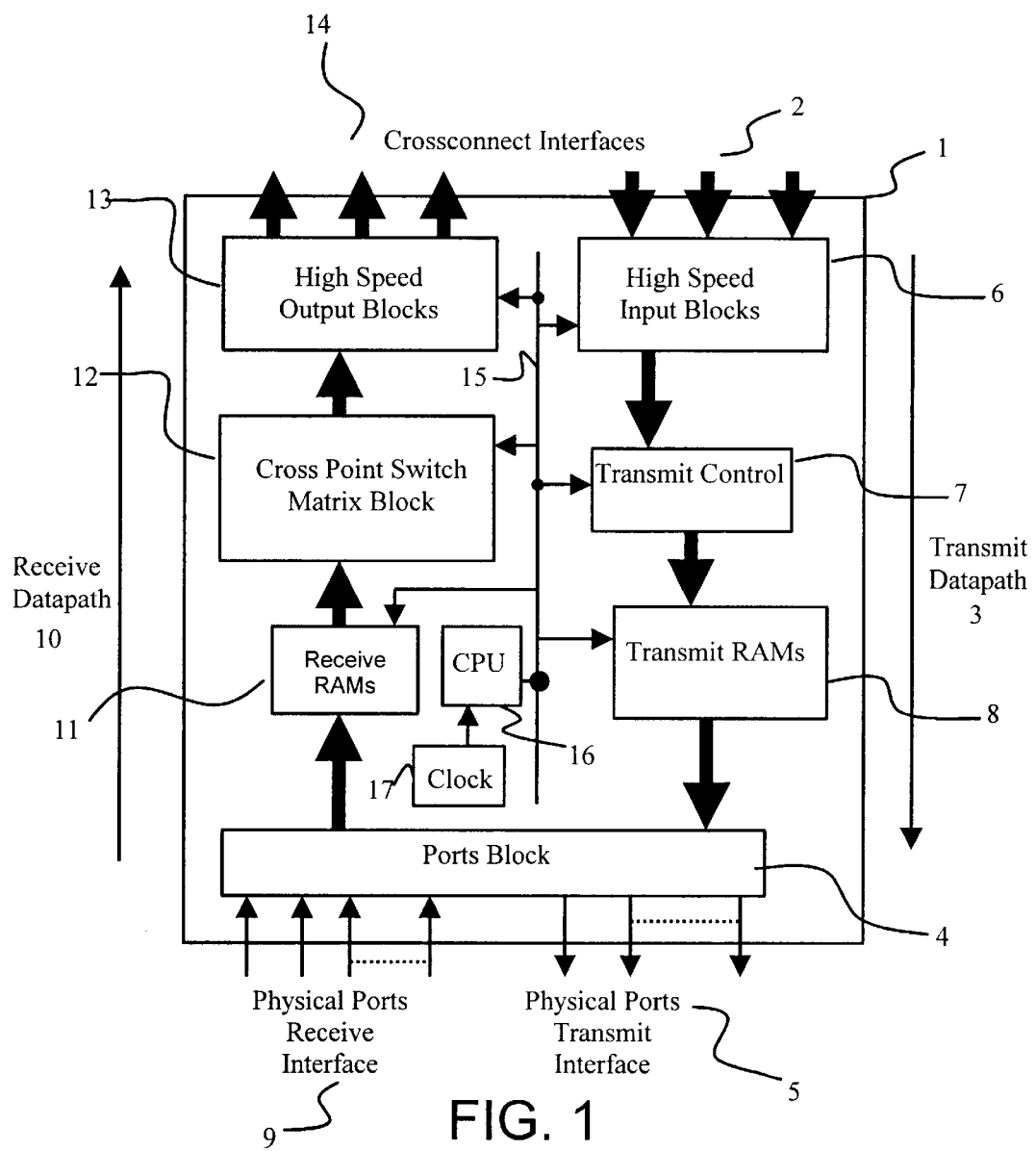
FIG. 1 is a schematic representation of a chip carrying a large scale application specific integrated circuit of the kind in which the invention may be deployed.

FIG. 1 of the drawings illustrates by way of a general example only, an application specific integrated circuit 1 which is implemented on a silicon chip. This particular circuit is intended to be part of a high speed switch which can receive, store and forward addressed data packets. The circuit 1 is intended to be one of a multiplicity (for example 4) similar circuits constituting an entire switch, each of the circuits such as circuit 1 being associated with a respective plurality of physical 'ports' by which the packets can be received and forwarded and which are connectable by appropriate connectors (not shown) to transmission links to other units forming part of a physical data communication network. Each of the circuits such as circuit 1 has interfaces 2 by which it may receive packets from the other circuits. One example of such an interface is described in published GB patent application number GB-2336075. From the interfaces extends a transmit data path 3 by which such packets are sent to a ports block 4 for appropriate processing, such as encapsulation, before the packets are sent to a transmit interface 5 for the respective ports. The transmit data path may include high speed input blocks 6, a transmit control 7, and transmit random access memory blocks (RAMs) 8 by means of which packets are temporarily stored before they are transmitted out to the physical ports. Packets received from the physical ports pass through a physical ports receive interface 9 into the ports block 4 and proceed by way of a receive data path 10. The receive data path includes receive random access memory 11, a cross point switch matrix block 12 and high speed output blocks 13 connected to respective cross connect interfaces 14. The circuit includes a bus system 15 and a CPU 16, which may perform look-ups, make routing decisions and control the flow of data to and from the random access memory. The circuit also includes an internal stable clock 17.

The foregoing is not intended to be a detailed description of the construction and manner of operation of the circuit but is included merely to illustrate a context in which the invention may be employed.

It is customary for data received at the input ports or the cross connect interface to be in a form which either contains or is accompanied by a clock signal defining the data rate of the data. In the physical interface, such as interface 9, for each of the ports relative thereto there is typically included a clock recovery circuit which in accordance with the format of the received clocked data extracts if necessary the clock accompanying the data and provides the data and its respective clock on distinct lines. Bearing in mind the multiplicity of ports which a circuit such as shown in FIG. 1 may be designed to serve, and the commonplace facility of working at a multiplicity of different data rates, there may be a large number, for example twenty or thirty, of such data recovery circuits in a circuit of this nature.

Very typically, the recovered data clock is employed for clocking the received data into a receive FIFO or addressable memory operated as a FIFO, before the necessary look-up process and forwarding decisions are made to determine where a stored packet should be sent. Data may be read out from the memory by means of an internal clock such as provided by the stable clock 17 in FIG. 1. It is obviously important in these and similar circumstances that the clock signal be in good form and in particular free from 10 glitches, which in the present context is intended to refer to additional transitions between a high and a low clock signal state so as to produce two short clock cycles within the period that should be occupied by a single clock cycle. Such glitches are difficult to detect reliably and yet it is important to detect them, particularly at the fabrication checking stage. Clock glitches may be produced by a variety of circumstances, including poor 'wiring' layout within the application specific integrated circuit or a variety of other causes. The invention is not limited to the detection of glitches in specifically a recovered clock, though this is a primary purpose of the invention and the subject of the specific example which will be described with reference to FIGS. 2, 3 and 4.

Figure 2:
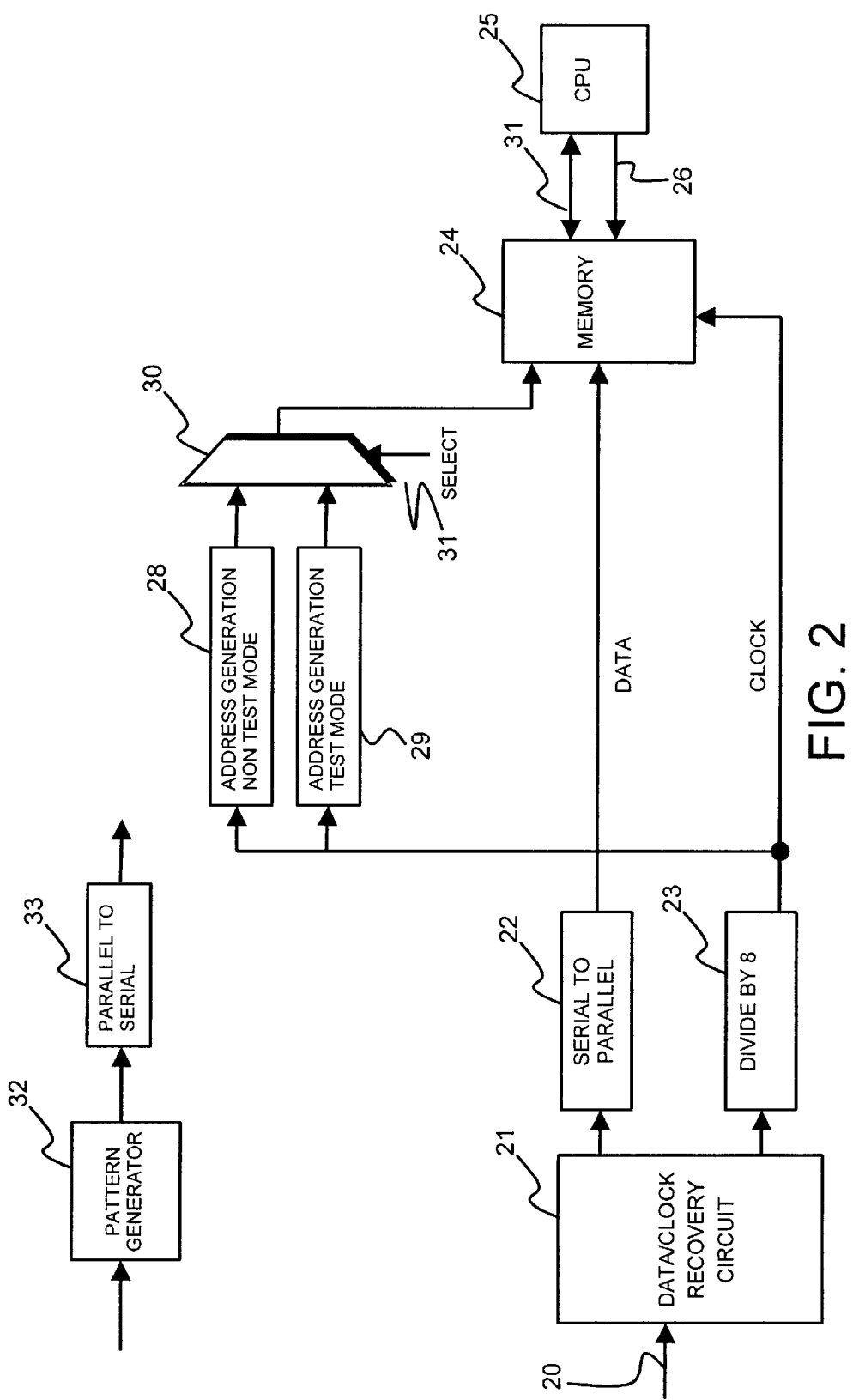
FIG. 2 is a schematic diagram illustrating one embodiment of the invention.

FIG. 2 illustrates part of an application specific integrated circuit which includes data and clock recovery and a memory into which recovered data is clocked by means of the recovered clock.

In the example shown in FIG. 2, a high speed serial data signal, which may contain its own data clock or be accompanied by a data clock, is received on a line 20 by the input of a data/clock recovery circuit 21. In the present example this circuit separates, in a manner well known per se, the received data into serial data and the high speed clock. The serial data is converted into parallel form, typically 8-bit (byte) form by means of a serial to parallel converter 22. The recovered clock signal is divided to produce a derived clock of frequency commencing with the parallel data rate at the output of the serial to parallel converter 22. In the present example the divider circuit 23 performs a division by eight.

Ignoring for a moment the circuits interposed between serial to parallel converter 22 and a memory 24, in a typical known system the output of the serial parallel converter would be fed by way of data lines (data) to a memory 24 and stored in memory in locations (each holding at least one byte) determined by an address generator, clocked to provide each new address in a sequence by means of the clock obtained from the divider 23. This clock also serves as the write clock for the memory 24. Typically the address controller would control memory 24 in the manner of a FIFO.

It is common practice for data within internal memory to be readable with the aid of an external processor. For example, outputs of the memory may be connected either by way of data buses or visibility buses to externally accessible terminals. An external CPU 25 may provide a read command and address data on lines 26 and be coupled to the memory by data lines 27 so that the external CPU can read data from a succession of locations in the memory 24 in any appropriate sequence.

A system as thus far described with reference to FIG. 2 from input 20 to memory 24 is well known. The controllable external accessing of memory by means of a CPU is likewise well known in itself In the specific example shown in FIG. 2, the output of the clock divider 23 is coupled to clock input of each of two address generators 28 and 29. The address generator 28 corresponds to the known address generator and may provide a sequence of memory addresses for controlling the memory 24 to store data words, in any suitable manner. This address generator is denoted 'non-test mode'.

The embodiment includes a second address generator 29 which is clocked by the output of the divider 23 to produce a repetitive sequence (as exemplified in the later Figures) of memory addresses. The length of the sequence is not particularly important. The address generator 29 may be a simple recycling counter which is incremented on (for example) each rising clock edge and recycles ('rolls over') when it reaches it maximum count. The outputs of the generators 28 and 29 may be selected by means of a multiplexer 30 having a select input 31. In normal (non-test) mode multiplexer 30 selects the output of generator 28 and the circuit operates in known manner. When a test of the recovered clock is desired, multiplexer is caused by way of the select input 31 to select the output of generator 29. The select input may be operated either in response to a command from the CPU or by recognition of a test signal to be described.

In the present example a repetition or sequence of data values d0, d1, etc which are preferably all different but which are at least such that no two consecutive values (e.g. bytes) are the same are generated 'off-chip' i.e. by another integrated circuit coupled to the circuit shown in the rest of FIG. 2 by a high speed link such as, for example, shown in published British patent applications numbers 2336074 and 2336075. The (parallel) bytes produced by a pattern generator 32 are converted to serial form by the parallel to serial circuit 33.

Figure 3:
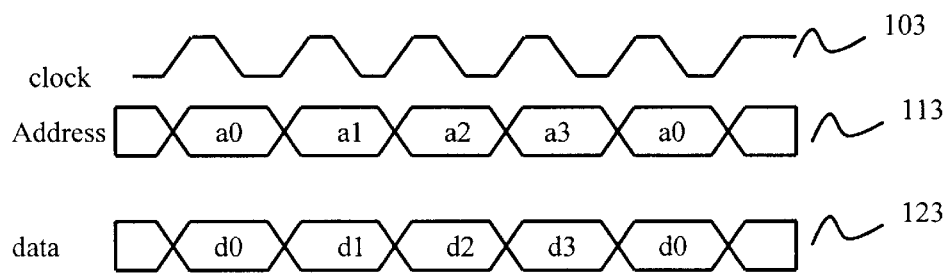
FIG. 3 is a timing diagram illustrating the storage of cyclic data patterns with a correct clock.

FIG. 3 illustrates the correspondence between the data values and the address locations on the assumption that the recovered clock is free from glitches. FIG. 3 shows the controlling clock 103 (the output of divider 23), waveform 113 illustrates the sequence of address values a0, a1 etc. output from the address generator 29 and waveform 123 illustrates the sequences of data values d0, d1 etc. In this example the lengths of the two sequences are the same.

If the controlling clock signal 103 is free from glitches then correspondence between the address values and the data values will be maintained indefinitely.

Figure 4:
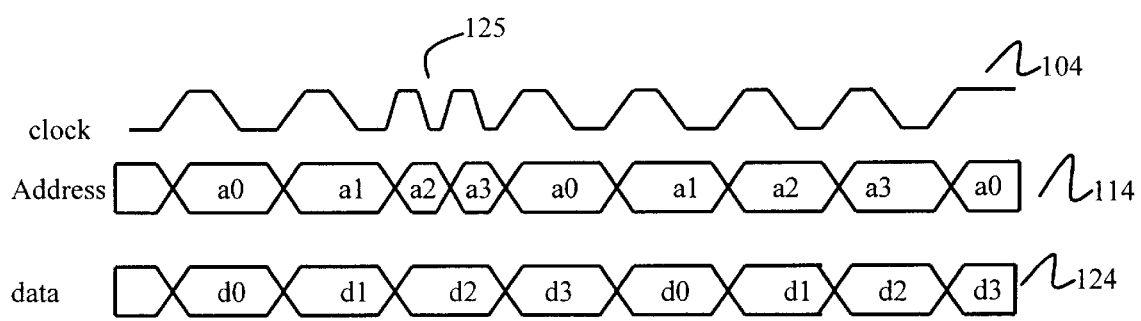
FIG. 4 is a timing diagram illustrating the storage of cyclic data patterns using a glitching clock.

FIG. 4 illustrates a circumstance where the recovered clock 104, is shown in conjunction with the address wave form 114 and the data wave form 124. It is assumed in this example that the clock 104 has a 'glitch' 125. Should this occur then since the recovered clock is controlling the stepping of the address control 25, there will be a transition of the clock occurring between the ordinary transitions and within the space of an ordinary clock cycle there will be two short clocks which will increment the address. In the example shown, the address data increments from address a2 to address a3 in the cycle in which it should remain at address a2.

The result of the glitch will be that data value d2 is read into storage locations a2 and a3. Thus two consecutive data locations will, improperly, contain the same data value. A readout of the stored values enables therefore the detection of this form of glitch.

The foregoing assumes that data is read from the memory in real time. In practice the invention could be varied by means of an address sequence which was much longer than the data sequence. Even if the data was to be read out in real time, it would be generally desirable to employ a cyclic address sequence consisting of substantially more than the relevant number of data values.

What is claimed is:

1. An application specific integrated circuit which includes:

(a) a clock recovery circuit responsive to an input signal to recover therefrom a sequence of data values and a recovered clock;

(b) a memory for receiving input data in addressable storage locations;

(c) a first address generator for generating memory addresses in a cyclic sequence said first address generator having an input responsive to said recovered clock signal, whereby the addresses generated by the first address generator increment in response to a repetitive transition in said recovered clock signal;

(d) a second address generator for generating memory addresses said second address generator having an input responsive to said recovered clock signal whereby the addresses generated by the second address generator increment in response to a repetitive transition in said recovered clock signal;

(e) a multiplexer for selecting between addresses generated by said first address generator and addresses generated by said second address generator; and (f) means for reading data values from a set of locations corresponding to the addresses generated by the first address generator to determine whether any two consecutive locations contain the same data.

* * * * *